US008545987B2

(12) United States Patent
Strader et al.

(10) Patent No.: US 8,545,987 B2
(45) Date of Patent: *Oct. 1, 2013

(54) THERMAL INTERFACE MATERIAL WITH THIN TRANSFER FILM OR METALLIZATION

(75) Inventors: Jason Strader, Cleveland, OH (US); Mark Wisniewski, Mentor, OH (US)

(73) Assignee: Laird Technologies, Inc., Earth City, MO (US)

( * ) Notice: Subject to any disclaimer, the term of this patent is extended or adjusted under 35 U.S.C. 154(b) by 1035 days.

This patent is subject to a terminal disclaimer.

(21) Appl. No.: 11/938,588

(22) Filed: Nov. 12, 2007

(65) Prior Publication Data

US 2009/0117373 A1    May 7, 2009

Related U.S. Application Data

(60) Provisional application No. 60/985,418, filed on Nov. 5, 2007.

(51) Int. Cl.
| | |
|---|---|
| *B32B 15/06* | (2006.01) |
| *B32B 15/08* | (2006.01) |
| *B32B 7/06* | (2006.01) |
| *B32B 27/20* | (2006.01) |
| *H01L 23/34* | (2006.01) |
| *H01L 23/36* | (2006.01) |

(52) U.S. Cl.
USPC .......... 428/457; 428/41.8; 428/446; 428/447; 428/448; 428/450; 257/701; 257/706; 257/707; 257/720; 361/679.46; 361/679.54; 361/679.61; 361/704; 361/705; 361/707; 361/712; 361/713; 165/185

(58) Field of Classification Search
None
See application file for complete search history.

(56) References Cited

U.S. PATENT DOCUMENTS

| | | | |
|---|---|---|---|
| 2,678,285 A | | 5/1954 | Browning |
| 3,723,373 A | | 3/1973 | Lucas |
| 4,047,804 A | | 9/1977 | Stephens |
| 4,686,141 A | | 8/1987 | Burns |
| 4,938,992 A | | 7/1990 | Mears |
| 5,300,809 A | * | 4/1994 | Nakamura et al. ............ 257/684 |

(Continued)

FOREIGN PATENT DOCUMENTS

| | | |
|---|---|---|
| EP | 1641040 A2 | 3/2006 |
| JP | 10-079594 | 3/1998 |

(Continued)

OTHER PUBLICATIONS

Infiltration and Embedding Protocol for Cells Grown on Cellophane/Dialysis Squares or Fixed Fruitbody Pieces, Modified Jan. 4, 2007, http://www3.cbs.umn.edu/labs/davem/Embed.doc, 2 pages.

(Continued)

*Primary Examiner* — Vivian Chen
(74) *Attorney, Agent, or Firm* — Harness, Dickey & Pierce, P.L.C.

(57) ABSTRACT

According to various aspects, exemplary embodiments are provided of thermal interface material assemblies. In one exemplary embodiment, a thermal interface material assembly generally includes a thermal interface material having a first side and a second side and a metallization layer having a layer thickness of about 0.0005 inches or less. The metallization layer is disposed along at least a portion of the first side of the thermal interface material.

32 Claims, 2 Drawing Sheets

(56) References Cited

U.S. PATENT DOCUMENTS

| | | | | |
|---|---|---|---|---|
| 5,314,732 | A | 5/1994 | Wiste | |
| 5,591,034 | A | 1/1997 | Ameen et al. | |
| 5,679,457 | A | 10/1997 | Bergerson | |
| 5,738,936 | A | 4/1998 | Hanrahan | |
| 5,741,579 | A | 4/1998 | Nishizawa | |
| 5,912,805 | A * | 6/1999 | Freuler et al. | 361/705 |
| 5,930,893 | A | 8/1999 | Eaton | |
| 5,950,066 | A | 9/1999 | Hanson et al. | |
| 6,037,659 | A | 3/2000 | Weixel | |
| 6,054,198 | A | 4/2000 | Bunyan et al. | |
| 6,090,484 | A | 7/2000 | Bergerson | |
| 6,162,663 | A | 12/2000 | Schoenstein et al. | |
| 6,165,612 | A | 12/2000 | Misra | |
| 6,197,859 | B1 | 3/2001 | Green et al. | |
| 6,344,104 | B1 | 2/2002 | Sekiya et al. | |
| 6,359,334 | B1 | 3/2002 | Jiang | |
| 6,372,997 | B1 * | 4/2002 | Hill et al. | 174/252 |
| 6,399,209 | B1 * | 6/2002 | Misra et al. | 428/447 |
| 6,451,422 | B1 | 9/2002 | Nguyen | |
| 6,461,722 | B1 | 10/2002 | Kittel et al. | |
| 6,523,608 | B1 | 2/2003 | Solbrekken et al. | |
| 6,613,430 | B2 | 9/2003 | Culbertson et al. | |
| 6,617,517 | B2 * | 9/2003 | Hill et al. | 174/252 |
| 6,644,395 | B1 * | 11/2003 | Bergin | 165/185 |
| 6,657,296 | B2 | 12/2003 | Ho et al. | |
| 6,657,297 | B1 | 12/2003 | Jewram et al. | |
| 6,761,928 | B2 | 7/2004 | Hill et al. | |
| 6,776,923 | B2 | 8/2004 | Balian et al. | |
| 6,835,453 | B2 | 12/2004 | Greenwood et al. | |
| 6,900,163 | B2 | 5/2005 | Khatri | |
| 6,913,812 | B2 | 7/2005 | Nishio et al. | |
| 6,919,504 | B2 * | 7/2005 | McCutcheon et al. | 174/16.3 |
| 6,946,190 | B2 * | 9/2005 | Bunyan | 428/334 |
| 6,965,071 | B2 * | 11/2005 | Watchko et al. | 174/377 |
| 6,974,723 | B2 | 12/2005 | Matayabas, Jr. et al. | |
| 6,987,671 | B2 * | 1/2006 | Houle | 361/704 |
| 7,037,594 | B2 | 5/2006 | Kojima et al. | |
| 7,078,109 | B2 * | 7/2006 | Hill et al. | 428/620 |
| 7,147,367 | B2 | 12/2006 | Balian et al. | |
| 7,187,083 | B2 * | 3/2007 | Lewis et al. | 257/772 |
| 7,229,683 | B2 | 6/2007 | Fischer et al. | |
| 7,347,354 | B2 * | 3/2008 | Hurley et al. | 228/219 |
| 7,369,411 | B2 * | 5/2008 | Hill et al. | 361/708 |
| 7,540,081 | B2 * | 6/2009 | Kumar et al. | 29/832 |
| 7,678,616 | B2 * | 3/2010 | Sir et al. | 438/122 |
| 7,744,991 | B2 * | 6/2010 | Fischer et al. | 428/317.9 |
| 7,811,862 | B2 * | 10/2010 | Mohammad et al. | 438/122 |
| 8,076,773 | B2 * | 12/2011 | Jewram et al. | 257/713 |
| 2001/0006715 | A1 * | 7/2001 | Pinter et al. | 428/90 |
| 2002/0034651 | A1 | 3/2002 | Yamagata et al. | |
| 2003/0203181 | A1 * | 10/2003 | Ellsworth et al. | 428/307.3 |
| 2004/0009353 | A1 | 1/2004 | Knowles et al. | |
| 2004/0161571 | A1 * | 8/2004 | Duvall et al. | 428/40.5 |
| 2005/0013119 | A1 | 1/2005 | Misra | |
| 2005/0073816 | A1 * | 4/2005 | Hill et al. | 361/708 |
| 2005/0077618 | A1 | 4/2005 | McCutcheon et al. | |
| 2005/0197436 | A1 * | 9/2005 | Czubarow | 524/405 |
| 2005/0256241 | A1 | 11/2005 | Sachdev et al. | |
| 2006/0128068 | A1 * | 6/2006 | Murray et al. | 438/120 |
| 2006/0194043 | A1 | 8/2006 | Nishiyama et al. | |
| 2006/0197176 | A1 | 9/2006 | Yang | |
| 2006/0292359 | A1 | 12/2006 | Nishio | |
| 2007/0164424 | A1 | 7/2007 | Dean et al. | |
| 2007/0230130 | A1 | 10/2007 | Alcoe et al. | |
| 2007/0231967 | A1 | 10/2007 | Jadhav et al. | |
| 2007/0235861 | A1 | 10/2007 | Chien et al. | |
| 2007/0241303 | A1 | 10/2007 | Zhong et al. | |
| 2009/0117345 | A1 * | 5/2009 | Strader et al. | 428/195.1 |
| 2009/0166854 | A1 | 7/2009 | Jewram et al. | |

FOREIGN PATENT DOCUMENTS

| | | |
|---|---|---|
| JP | 2003-086991 | 3/2003 |
| JP | 2004-080040 | 3/2004 |
| JP | 2004-228217 | 8/2004 |
| JP | 2006-528434 | 12/2006 |
| WO | WO 2006/017193 | 2/2006 |

OTHER PUBLICATIONS

Thermally Conductive, Reworkable, Elastomeric Interposer for Chip to Heat Sink Attachment: Dec. 1, 1992 UTC United States English (United States); IMB Technical Disclosure Bulletin, vol. 5, No. 37, Dec. 1992; pp. 241-242.

Flexible Heat Conducting Sheet Material for Semiconductor Packages: Apr. 1, 1983 UTC United States English (United States); IBM disclosure Apr. 1983; pp. 5740-5743.

Ablefilm 566k Low Temperature Cure Adhesive Film: Technical Data Sheet; Published: Nov. 1995, 2 pages.

Hi-Flow® 225FT, Reworkable, Pressure Sensitive Phase Change Material: The Bergquist Company (www.bergquistcompany.com), 1 page (accessed and printed from Internet on Oct. 23, 2007).

MultiPhase™—T557 & T558, Low Thermal Resistance Thermflow™ Phase Change Pads: Chomerics (www.chomerics.com), 2 pages (accessed and printed from Internet on Oct. 23, 2007).

Website: http://www.electronicsweekly.com/products/2007/10/05/2057/bergquist+sil-pad+1200+thermal+interface+material.htm; Products—Emech & Enclosures; Bergquist SIL-PAD 1200 thermal interface material, Published: Oct. 5, 2007, 3 pages.

Website: http://www.loctite.com/int_henkel/loctite/binarydata/pdf/lt3758a_PhaseChange.pdf; Henkel International; Date Accessed: Oct. 15, 2007, 2 pages.

T-mate™ 2900 Series (accessed and retrieved from Internet Oct. 23, 2007), 2 pages.

T-flex™ 600 Series Thermal Gap Filler (accessed and retrieved from Internet Nov. 9, 2007), 2 pages.

T-gard™ 500, (accessed and retrieved from Internet Nov. 9, 2007), 2 pages.

T-pcm™ 580 Series, (accessed and retrieved from Internet Nov. 9, 2007), 2 pages.

T-pli™ 200 Series Gap Filler, (accessed and retrieved from Internet Nov. 9, 2007), 2 pages.

T-flex™ 300 Series Thermal Gap Filler (accessed and retrieved from Internet Nov. 9, 2007), 2 pages.

International Search Report and Written Opinion for PCT/US2009/043716, dated Feb. 17, 2010, 9 pages.

Supplementary European Office Action from European application No. 0887414.8 (now published as EP2207674) which is related to the instant application through a priority claim, dated Mar. 17, 2011, 5 pages.

European Office Action from European application No. 0887414.8 (now published as EP2207674) which is related to the instant application through a priority claim, dated Mar. 17, 2011, 5 pages.

European Search Report from European application No. 0887414.8 which is related to the instant application through a priority claim, dated Jan. 19, 2011, 3 pages.

Non-Final Office Action dated Mar. 13, 2012 issued for U.S. Appl. No. 12/204,228. U.S. Appl. No. 12/204,228 claims priority to the instant application; 39 pages.

Japanese Office Action (dated Jan. 17, 2012) from related co-pending Japanese Patent Aplication No. 2010/533134 which is a national phase of PCT International Application No. PCT/US2008/075172 which claims priority to the instant application; 4 pages.

* cited by examiner

THERMAL INTERFACE MATERIAL WITH THIN TRANSFER FILM OR METALLIZATION

CROSS-REFERENCE TO RELATED APPLICATION

This application claims the benefit of U.S. Provisional Application No. 60/985,418 filed Nov. 5, 2007. The disclosure of this provisional application is incorporated herein by reference.

FIELD

The present disclosure generally relates to thermal interface materials for establishing thermal-conducting heat paths from heat-generating components to heat sinks.

BACKGROUND

The statements in this section merely provide background information related to the present disclosure and may not constitute prior art.

Electrical components, such as semiconductors, transistors, etc., typically have pre-designed temperatures at which the electrical components optimally operate. Ideally, the pre-designed temperatures approximate the temperature of the surrounding air. But the operation of electrical components generates heat which, if not removed, will cause the electrical component to operate at temperatures significantly higher than its normal or desirable operating temperature. Such excessive temperatures may adversely affect the operating characteristics of the electrical component and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor. In some devices, an electrical insulator may also be placed between the electrical component and the heat sink.

SUMMARY

According to various aspects, exemplary embodiments are provided of thermal interface material assemblies. In one exemplary embodiment, a thermal interface material assembly generally includes a thermal interface material having a first side and a second side and a metallization layer having a layer thickness of about 0.0005 inches or less. The metallization layer is disposed along at least a portion of the first side of the thermal interface material.

In another exemplary embodiment, a thermal interface material assembly generally includes a thermal interface material having a first side and a second side and a metallization layer having a layer thickness of about 0.0005 inches or less. The metallization layer is supported by an upper release liner including a release coating. The upper release liner is laminated to the thermal interface material such that the metallization layer is generally between the release coating and the first side of the thermal interface material. A lower release liner including a release coating is also laminated to the thermal interface material such that the release coating is generally between the lower release liner and the second side of the thermal interface material.

Additional aspects provide methods relating to thermal interface material assemblies, such as methods of using and/or making thermal interface assemblies. In one exemplary embodiment, a method for making a thermal interface material assembly generally includes providing a thermal interface material with a metallization layer along at least a portion of a first side of the thermal interface material such that the metallization layer has a layer thickness of about 0.0005 inches or less.

Another exemplary embodiment provides a method associated with heat transfer from a heat-generating component. In this exemplary embodiment, a method generally includes installing a thermal interface material assembly generally between a surface of a heat-generating component and a surface of a heat sink to thereby establish a thermally conducting heat path from the heat-generating component to the heat sink. The thermal interface material assembly may include a thermal interface material and a metallization layer having a layer thickness of about 0.0005 inches or less disposed along at least a portion of the thermal interface material.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
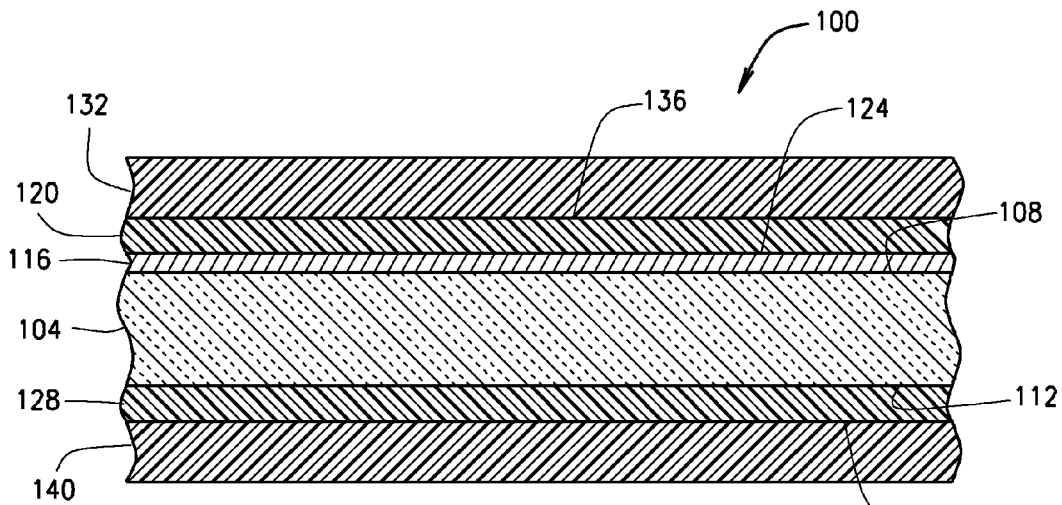
FIG. 1 is a cross-sectional view of a thermal interface material assembly having a thermal interface material, a metallization or metal layer, release coatings, and release liners according to exemplary embodiments.

The following description is merely exemplary in nature and is in no way intended to limit the present disclosure, application, or uses.

Thermal interface materials with thick foils have been used between heat-generating components and heat sinks to establish heat-conduction paths therebetween. As recognized by the inventors hereof, however, the thickness of the foil (e.g., one mil thick, two mils thick, etc.) results in a relative long heat conduction path, such that the foil thickness negatively impacts thermal performance by increasing thermal impedance. Despite the negative thermal impact, foils having thicknesses of one mil or even two mils are presently used as self-supporting, stand-alone, free-standing materials that can be applied to thermal interface materials without using carrier liners. Plus, thin metal layers or transfer films are usually too fragile to be self-supporting and thus do not lend themselves to handling as a stand-alone layer.

Because the inventors hereof recognized that the use of thinner foils provides shorter heat-conduction paths, the inventors have disclosed herein various exemplary embodiments that include a thermal interface material with a thin metallization or metal layer or film. The reduced thickness allows for improved thermal performance as compared to those thermal interface materials with much thicker foils. In addition to short heat paths providing lower thermal impedance for the heat-conducting path, the thinness of the metallization or metal layer or film also allow for good conformance with a mating surface, which also help lower thermal impedance as thermal impedance also depends, at least in part, upon the degree of effective surface area contact therebetween.

The ability to conform to a mating surface tends to be important as the surfaces of a heat sink and/or a heat-generating component are typically not perfectly flat and/or smooth, such that air gaps or spaces (air being a relatively poor thermal conductor) tend to appear between the irregular mating surfaces and thus increase the path's impedance to conduction. Therefore, removal of air spaces may thus also help lower the path's thermal impedance and increases the path's thermal conductivity, thereby enhancing the conducting of heat along the thermal path.

As compared to thick foils, various embodiments disclosed herein include a thin metallization or metal layer or film, which will have less of an adverse affect (smaller increase in thermal impedance) on the thermal performance of the thermal interface material. To help illustrate this, the following non-limiting examples and test results are provided for purposes of illustration only and not for limitation. The thermal resistance was measured for test specimens made from T-pcm™ 580S series thermal phase change materials available from Laird Technologies, Inc. For the test specimens, foils were applied or coated onto the thermal phase change materials in different foil thicknesses. The thermal resistance was determined to be 0.019° Celsius-in$^2$/W for a test specimen having a foil with a 0.0001 inch thickness applied to a T-pcm™ 580S series thermal phase change material via transfer from a polyester film. By way of comparison, the thermal resistance was determined to be 0.04° Celsius-in$^2$/W for a test specimen having a self-supporting or free-standing film with a thickness of 0.0007 inches.

In addition to thermal performance improvement, some exemplary embodiments also include a protective liner on or over a relatively thin metallization or metal layer or film. In such embodiments, the protective liner may be removed before installation. Use of the protective liner may thus help reduce the chance of surface imperfections that may occur with self-supporting or free-standing stand-alone thick foils that do not include any protective liner.

Accordingly, various exemplary embodiments are disclosed herein that include a thermal interface material with a thin metallization or metal layer of film, which are capable of releasing cleanly and easily from mating components, for example, to permit ready access for reworking to a printed circuit board, central processing unit, graphics processing unit, memory module, or other heat-generating component. In addition, the thin metallization or metal layer or film may also provide one or more of the following advantages in some embodiments: reduced electrostatic discharge of the thermal interface material; preventing (or at least reduced possibility of) thermal interface material constituents (e.g., silicone, etc.) from contacting and possibly contaminating mating surfaces; electrical conductivity on the side of the thermal interface material having the metallization or metal layer or film; and/ or light from LEDs or other light sources being reflected off the side of the thermal interface material having the metallization or metal layer or film.

Referring now to FIG. 1, there is shown an exemplary embodiment of a multi-layered construction or thermal interface material (TIM) assembly 100 embodying one or more aspects of the present disclosure. As shown in FIG. 1, the illustrated TIM assembly 100 generally includes a thermal interface material 104, a metallization or metal layer 116, release coatings 120, 128, and release liners 132 and 140 (or more broadly, substrates or supporting layers 132 and 140). The various portions 104, 116, 120, 128, 132, and 140 of the TIM assembly 100 are described in more detail herein.

The thermal interface material 104 may be formed from various materials, some of which are listed below in a table setting forth exemplary materials from Laird Technologies, Inc. of Saint Louis, Mo., and, accordingly, identified by reference to trademarks of Laird Technologies, Inc. The table and the materials listed therein may be used as a thermal interface material in any one or more exemplary embodiments disclosed herein, and is provided for purposes of illustration only and not for purposes of limitation.

In some embodiments, the thermal interface material 104 is a gap filler (e.g., T-flex™ gap fillers or T-pli™ gap fillers from Laird Technologies, etc.). By way of example, the gap filler may have a thermal conductivity of about 3 W/mK and a thermal impedance (as determined at ten pounds per square inch using ASTM D5470 (modified test method)) of about 0.46° Celsius-in$^2$/W, or 0.62° Celsius-in$^2$/W, or 0.85° Celsius-in$^2$/W, or 1.09° Celsius-in$^2$/W, or 1.23° Celsius-in$^2$/W, etc. By way of further example, the gap filler may have a thermal conductivity of about 1.2 W/mK and a thermal impedance (as determined at ten pounds per square inch using ASTM D5470 (modified test method)) of about 0.84° Celsius-in$^2$/W, or 1.15° Celsius-in$^2$/W, or 1.50° Celsius-in$^2$/W, or 1.8° Celsius-in$^2$/W, or 2.22° Celsius-in$^2$/W, etc. Additional exemplary gap fillers may have a thermal conductivity of about 6 W/mK and a thermal impedance (as determined at ten pounds per square inch using ASTM D5470 (modified test method) of about 0.16° Celsius-in$^2$/W, or 0.21° Celsius-in$^2$/W, or 0.37° Celsius-in$^2$/W, or 0.49° Celsius-in$^2$/W, or 0.84° Celsius-in$^2$/W, etc.

In other embodiments, the thermal interface material 104 is a phase chase change material (e.g., T-pcm™ 580S series phase change material from Laird Technologies, Inc., etc.). By way of example, the phase change material may have an phase change softening point of about 50° Celsius, an operating temperature range of about −40° Celsius to 125° Celsius, a thermal conductivity of about 3.8 W/mK and a thermal impedance (as determined at ten pounds per square inch using ASTM D5470 (modified test method)) of about 0.019° Celsius-in$^2$/W, or 0.020° Celsius-in$^2$/W, etc.

In still further embodiments, the thermal interface material 104 is a thermally conductive electrical insulator (e.g., T-gard™ 500 thermally conductive electrical insulators from Laird Technologies, etc.). By way of example, the thermally conductive electrical insulator may have a thermal impedance (as determined at ten pounds per square inch using ASTM D5470 (modified test method)) of about 0.6° Celsius-in$^2$/W, etc.

The table immediately below lists various exemplary thermal interface materials that may be used as a thermal interface material in any one or more exemplary embodiments described and/or shown herein. These exemplary materials are commercially available from Laird Technologies, Inc. of Saint Louis, Mo., and, accordingly, have been identified by reference to trademarks of Laird Technologies, Inc. This table and the materials and properties listed therein are provided for purposes of illustration only and not for purposes of limitation.

| Name | Construction Composition | Type |
| --- | --- | --- |
| T-flex ™ 300 | Ceramic filled silicone elastomer | Gap Filler |
| T-flex ™ 600 | Boron nitride filled silicone elastomer | Gap Filler |
| T-pli ™ 200 | Boron nitride filled, silicone elastomer, fiberglass reinforced | Gap Filler |
| T-pcm ™ 580 | Non-reinforced film | Phase Change Material |
| T-pcm ™ 580S | Non-reinforced film | Phase Change Material |
| T-gard ™ 500 | Ceramic filled silicone rubber on electrical grade fiberglass | Thermally Conductive Insulator |

In addition to the examples listed in the table above, other thermal interface materials may also be used, which are preferably better thermal conductors than air alone. Other exemplary materials include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. In some embodiments, one or more conformable thermal interface pads are used having sufficient compressibility and flexibility for allowing a pad to relatively closely conform to the size and outer shape of an electrical component when placed in contact with the electrical component when the shielding apparatus is installed to a printed circuit board over the electrical component. By engaging the electrical component in this relatively close fitting and encapsulating manner, a conformable thermal interface pad can conduct heat away from the electrical component to the cover in dissipating thermal energy. Additionally, thermal interface may also be formed from sufficiently soft, conformable, and/or compliable materials to be relatively easily forced into or extruded into the holes in a cover as disclosed herein.

With further reference to FIG. 1, the TIM assembly 100 includes the metallization or metal layer 116 disposed generally between the release coating 120 and an upper surface or first side 108 of the thermal interface material 104. The metallization or metal layer 116 may be formed from various materials, which preferably have relatively good thermal conductivity and are relatively compliant, conformable or flexible for conforming to a surface (e.g., a surface of a heat-generating component or heat sink, etc.). Using a material that is a good thermal conductor and capable of good conformance with a mating surface help provide a lower thermal impedance. In some embodiments, the metallization or metal layer 116 may be formed from a material having a higher thermal conductivity, but which is less conformable, than the thermal interface material 104. In addition, the metallization or metal layer 116 may also help the thermal interface material 104 release cleanly and easily from a heat-generating component, for example, for reworking or servicing the heat-generating component. In some embodiments, the metallization or metal layer 116 comprises copper. Alternative embodiments may include other materials used for layer or film 116, including other metals (e.g., argentum, tin, metal alloys, etc.) and non-metal materials. By way of further example, the metallization or metal layer 116 may comprise aluminum having a thickness of less than or equal to about 0.0005 inches. Other embodiments may have a metallization or metal layer 116 with a thickness of about 0.0002 inches, 0.0001 inches, or less than 0.0001 inches, etc. Also disclosed herein, the metallization or metal layer or film 116 may be provided in some embodiments as a subcomponent or part of a product from the Dunmore Corporation of Bristol, Pa., such as products under the trade name Dun-Tran (e.g., Dunmore DT273 metallized film having a heat-activated adhesive layer, Dunmore DT101 metallization transfer layer, etc.).

Various processes and technologies may be employed to provide a thermal interface material with a metallization or metal layer (or film) depending on the particular embodiment. Some example processes include vapor deposition, vacuum metallization, lamination, calendaring, sputtering, electrolytic plating, evaporating, flash coating, etc.

In addition, FIG. 1 only shows a single metallization or metal layer 116. Alternative embodiments may include a second/lower metallization or metal layer below the thermal interface material. In addition, some embodiments may include more than one metallization or metal layer (e.g., multiple metal layers of different materials, of the same material, of different allows, etc.) disposed, coated, or otherwise provided fully or partially on one or both sides of the thermal interface material. For example, another embodiment may include a first copper metallization or metal layer formed directly on top of the thermal interface material, and a second nickel metallization or metal layer formed directly on top of the copper, for example, through sputtering technology to improve oxidation resistance. Still yet other embodiments may include multiple metallization or metal layers of the same material, different materials, different alloys, etc.

In the illustrated embodiment of FIG. 1, the TIM assembly 100 includes the release coatings 120 illustrated on top of the upper surface or side 124 of the metallization layer 116. The TIM assembly 100 also includes another release coating 128 illustrated directly below the lower surface or second side 112 of the thermal interface material 104. The assembly further includes the release liner 132 illustrated on top of the upper surface or side 136 of the release coating 120. The TIM assembly 100 additionally includes the release liner 140 illustrated directly below the lower surface or second side 144 of the release coating 128.

With continued reference to FIG. 1, the metallization or metal layer 116 is illustrated as a separate layer from the release coating 120 and release liner 140. In some embodiments, however, the metallization or metal layer 116, release coating 120, and release liner 140 may be provided as a subassembly, which, in turn, is then laminated, calendared, or otherwise provided to the thermal interface material 104. In these exemplary embodiments, the release liner 140 may comprise a substrate or supporting layer to which is applied the release coating 120 and the metallization or metal layer (or film) 116. The metallization or metal layer 116 may be a metal film having a thickness of about 0.0005 inches or less (e.g., 0.0002 inches, 0.0001 inches, etc.). By way of example only, a film or layer of metal may be provided, applied, or coated onto the release side (the side having the release coating 120 thereon) of the substrate, supporting layer, or release liner 132. The metal may be provided, applied, or coated onto the release side by using vapor deposition, vacuum metallization, sputter technology, electrolytic plating, evaporating, flash coating, etc. The thermal interface material 104 and the subassembly (comprising the release liner 132, release coating 120, and metallization or metal layer 116) may then be laminated, such that the film or layer of metal 116 is disposed generally between the release coating 120 and thermal interface material 104 as shown in FIG. 1.

Figure 5:
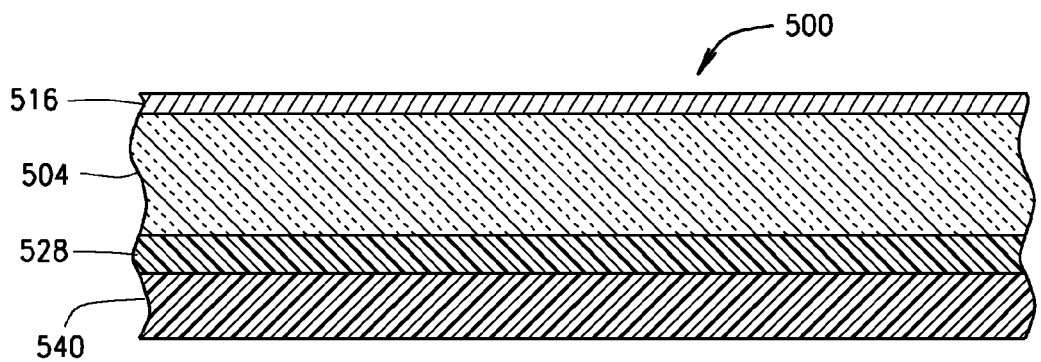
FIG. 5 is a cross-sectional view of another exemplary embodiment of a thermal interface material assembly having a thermal interface material, a metallization or metal layer, a lower release coating, and a lower release liner.

In an alternative embodiment shown in FIG. 5, a film or layer of metal 516 may be directly provided or applied to a surface or side of the thermal interface material 504, for example, via vapor deposition, vacuum metallization, sputtering, flash coating, electrolytic plating, evaporating, etc. In this example, the TIM assembly 500 includes a lower release coating 528 and release liner 540. But in this alternative embodiment, the TIM assembly 500 is shown in FIG. 5 without an upper release coating or an upper release liner. As the metallization or metal layer 516 is directly provided, applied, or metallized to the thermal interface material 504 in this embodiment, the metallization or metal layer 516 is not provided to the thermal interface material 504 via lamination or calendaring of a subassembly including a supporting layer or substrate for the metal. By way of comparison, the metallization or metal layer 116 of the TIM assembly 100 shown in FIG. 1 may be provided by way of laminating or calendaring the thermal interface material 104 and the subassembly comprised of the release liner 132 and the release coating 120 and metal layer 116 supported thereby. As disclosed herein, the metallization or metal layer 116 may be provided to the TIM assembly 100 by way of depositing (e.g., vapor deposition, vacuum metallization, sputter technology, etc.) metal to the release side of the release liner, substrate, or supporting layer 132, which side has the release coating 120 thereon.

Various materials may be used for the release coatings 120, 128 and release liners 140 shown in FIG. 1 as well as the other exemplary embodiments disclosed herein. By way for further example, the release liners 132 and 140 may comprise a substrate, supporting layer, film, or liner formed of paper, polyester propylene, etc., which has been siliconized to provide a release coating 120, 128 thereon. The release liners 132, 140 may be configured as the supporting substrate, layer, or film for the corresponding release coatings 120, 128, which, in turn, may be configured as low surface energy coatings on the supporting substrate, layer, or film, for example, to allow easy removal of the supporting substrate, layer, or film from the thermal interface material. In some embodiments, the release liner 132 and 140 are configured so as to help protect the other layers 104, 116 of the TIM assembly 100, for example, during transport, shipping, etc.

During an exemplary installation process, the release liners 132 and 140 may be removed (e.g., peeled off, etc.) from the TIM assembly 100. The removal of the release liners 132, 140 is facilitated by the release coatings 120, 128. The thermal interface 104 and metallization or metal layer 116 may then be positioned generally between a heat sink and a heat-generating component (e.g., component of a high frequency microprocessor, printed circuit board, central processing unit, graphics processing unit, laptop computer, notebook computer, desktop personal computer, computer server, thermal test stand, etc.). For example, the thermal interface material's lower surface or side 112 (now exposed due to removal of the release liner 140) may be positioned against and in thermal contact with a surface of the heat sink. The upper surface or side 124 of the metallization or metal layer 116 (also exposed due to removal of the release liner 132) may be positioned against and in thermal contact with a surface of the heat-generating component. Accordingly, a thermally-conducting heat path from the heat-generating component to the heat sink may thus be established via the metallization or metal layer 116 and thermal interface material 104. Alternative embodiments may reverse the orientation of the thermal interface 104 and the metallization or metal layer 116 relative to the heat-generating component and heat sink. That is, some embodiments may include positioning the lower surface or side 112 of the thermal interface material 104 against and in thermal contact with a surface of the heat-generating component, and positioning the upper surface or side 124 of the metallization or metal layer 116 against and in thermal contact with the heat sink. In yet other embodiments, the thermal interface 104 and metallization or metal layer 116 may be used and installed elsewhere. The description provided above regarding an exemplary installation process for the TIM assembly 100 is provided for purposes of illustration only, as other embodiments of a TIM assembly may be configured and/or installed differently. For example, some embodiments include a TIM assembly having at least one metallization or metal layer on the upper and lower surface of the thermal interface. In such embodiments, the installation process may thus include positioning the upper metallization or metal layer against and in thermal contact with a surface of a heat sink, and the lower metallization or metal layer against and in thermal contact with a surface of a heat-generating component.

Some embodiments may also include a heat-activated layer. For example, a heat-activated layer having a thickness of about 0.0003 inch may be disposed on top of the metallization or metal layer 116. By way of further example, some embodiments may include a thermal interface material comprising a gap filler to which has been laminated a release liner, substrate, or supporting layer, which, in turn, may include a metallization or metal layer or film, a release coating, and a heat-activated layer. In such exemplary embodiments, the heat-activated layer may add robustness for helping inhibit the metallization or metal layer or film from breaking apart and/or flaking when the gap filler is deflected, for example, during installation in a gap between a heat-generating component and a heat sink. The heat-activated layer may also provide more secure adhesion to the gap filler, which, in turn, may be made of silicone to which it may be difficult to bond anything.

With continued reference to FIG. 1, an exemplary embodiment includes the thermal interface material 104 having a layer thickness (between the first and second sides 108, 112) of about 0.0075 inches. Continuing with this example, the metallization or metal layer 116 may have a layer thickness of about 0.0005 inches or less (e.g., 0.0002 inches, 0.0001 inches, less than 0.0001 inches in some embodiments, etc.). The release coatings 120 and 124 may each have a respective layer thickness within a range of about 0.00025 inches and 00075 inches. The release liners 132 and 140 may each have a respective layer thickness of about 0.001 inch. In one particular embodiment, the metallization or metal layer 116 may have a layer thickness of about 0.0005 inches. In another embodiment, the metallization or metal layer 116 may have a layer thickness of about 0.0002 inches. In a further embodiment, the metallization or metal layer 116 may have a layer thickness of about 0.0001 inches. In additional embodiment, the metallization or metal layer 116 may have a layer thickness less than 0.0001 inches. These numerical dimensions disclosed herein are provided for illustrative purposes only. The particular dimensions are not intended to limit the scope of the present disclosure, as the dimensions may be varied for other embodiments depending, for example, on the particular application in which the embodiment will be used.

A description will now be provided of various exemplary methods for making or producing a TIM assembly (e.g., 100 (FIG. 1), 500 (FIG. 5), etc.). These examples are provided for purposes of illustration, as other methods, materials, and/or configurations may also be used.

Figure 2:
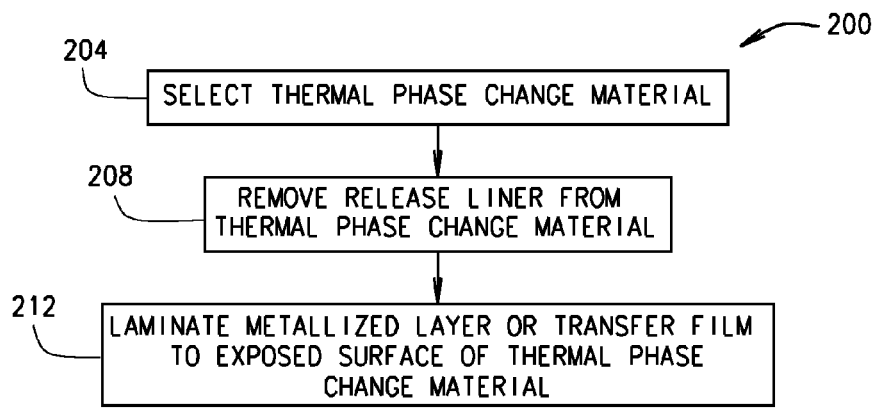
FIG. 2 is a process flow diagram of an exemplary method that includes laminating a metallization layer or transfer film to a thermal phase change material according to exemplary embodiments.

FIG. 2 illustrates an exemplary method 200 by which a TIM assembly may be formed. In this particular exemplary method 200, process 204 includes selecting a thermal phase change material (e.g., 104, etc.) to which is attached an upper release liner and a lower release liner (e.g., 140, etc.). By way of example, the thermal phase change material may be a T-pcm™ 580S series thermal phase change material from Laird Technologies, Inc. Alternative materials may also be used, including thermal interface materials without any release liner or only one release liner.

With continued reference to FIG. 2, process 208 includes removing one of the release liners from the thermal phase change material. In those embodiments in which the thermal phase change material selected at process 204 does not include any preexisting release liners or includes only one release liner, process 208 may not be needed.

Process 212 includes laminating a metallization, metal layer or transfer film (e.g., 116, etc.) to the exposed surface of the thermal phase change material from which the release liner was previously removed at process 208. During the laminating process 212, for example, the various materials may be drawn between a pair of laminating rollers that form a laminating nip. By way of example, process 212 may include laminating a Dunmore DT273 metallized film having heat-activated adhesive layer to the exposed surface of the thermal phase change material. In which case, the thermal phase change material and the Dunmore DT273 metallized film may thus be drawn between a pair of laminating rollers that form a laminating nip. As another example, process 212 may include laminating a Dunmore DT101 metallization transfer layer to the exposed surface of the thermal phase change material. In this latter example, the thermal phase change material and the Dunmore DT101 metallization transfer layer may thus be drawn between a pair of laminating rollers that form a laminating nip. Dunmore DT273 metallized film generally includes a siliconized (or release coating) liner (or supporting layer, substrate, or film) having a thickness of about 1 mil or 2 mil, which has been metallized with aluminum at about 0.1 mils thickness and to which a heat seal layer is deposited on top of the metallization layer with a thickness of about 0.3 mils. Dunmore DT101 metallized transfer film is similarly constructed as the DT273 but without the heat seal layer.

The thermal resistance was measured for test specimens made in accordance with the method 200. For this testing, first and second test specimens were created. The first test specimen included a T-pcm™ 580S series thermal phase change material having a release liner on its lower side and a Dunmore DT273 metallized film laminated to the thermal phase change material's upper side (i.e., the side from which the release liner had been removed at process 208). The second test specimen included a T-pcm™ 580S series thermal phase change material having a release liner on its lower side and a Dunmore DT101 metallized transfer film laminated to the thermal phase change material's upper side (i.e., the side from which the release liner had been removed at process 208).

The thermal resistances for the first and second test specimens were tested separately as follows. The lower release liner (i.e., the lower pre-existing release liner that was not removed at process 208) was removed from the thermal phase change material. The thermal phase change material was then placed exposed side down (the side from which the lower release liner was removed, or the side not having laminated thereto the Dunmore product) on an ASTM D5470 platen. The protective release liner was removed from the Dunmore DT273 metallized film for the first test specimen and from the Dunmore DT101 metallized transfer film for the second test specimen. For each test specimen, the pressure was closed to a pressure of 50 pounds per square inch, and thermal resistance was measured at 70° C. Using this exemplary testing, the thermal resistance was about $0.08°$ C.-in$^2$/W for the first test specimen, which was formed from T-pcm™ 580S series phase change material and Dunmore DT273 metallized film). The thermal resistance was about $0.02°$ C.-in$^2$/W for the second test specimen, which was formed from T-pcm™ 580S series phase change material and Dunmore DT101 metallized transfer film.

By way of comparison, the thermal resistance of the T-pcm™ 580S series phase change material alone (i.e., without any metallization or metal layers laminated thereto and without any release liners or release coatings) was about $0.01°$ C.-in$^2$/W. In addition, the thermal resistance was about $0.042°$ C.-in$^2$/W for a T-pcm™ 580S series phase change material on a 0.7 mil thick aluminum foil. From the above testing, it may be observed that the second test specimen (formed from T-pcm™ S series phase change material and Dunmore DT101 metallized transfer film) yielded better thermal performance results than the first test specimen (formed from T-pcm™ 580S series phase change material and Dunmore DT273 metallized film) and better than the T-pcm™ 580S series phase change material on a 0.7 mil thick aluminum foil.

Figure 3:
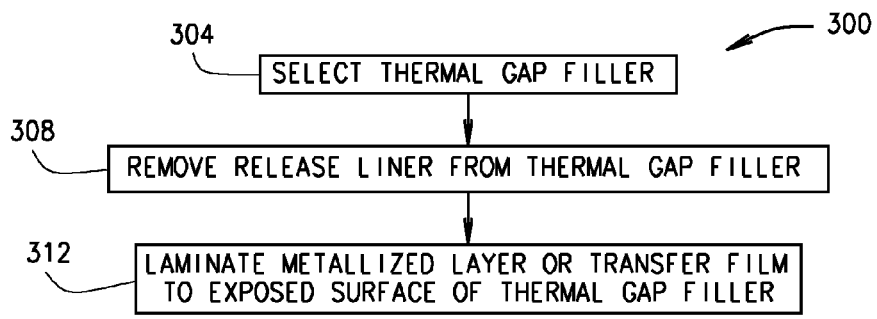
FIG. 3 is a process flow diagram of another exemplary method that includes laminating a metallization layer or transfer film to a thermal gap filler according to exemplary embodiments.

FIG. 3 illustrates an exemplary method 300 by which a TIM assembly may be formed. In this particular exemplary method 300, process 304 includes selecting a thermal gap filler (e.g., 104, etc.) to which is attached an upper release liner and a lower release liner (e.g., 140, etc.). By way of example, the thermal gap filler may be a T-flex™ 600 series gap filler from Laird Technologies, Inc. In other embodiments, the thermal phase change material may be a T-pcm™ 580S series thermal phase change material from Laird Technologies, Inc. Alternative materials may also be used, including thermal interface materials without any release liner or only one release liner.

With continued reference to FIG. 3, process 308 includes removing one of the release liners from the thermal gap filler. In those embodiments in which the thermal gap filler selected at process 304 does not include any preexisting release liners or includes only one release liner, process 308 may not be needed.

Process 312 includes laminating a metallization, metal layer or transfer film (e.g., 116, etc.) to the exposed surface of the thermal gap filler from which the release liner was previously removed at process 308. During the laminating process 312, for example, the various materials may be drawn between a pair of laminating rollers that form a laminating nip. By way of example, process 312 may include laminating a Dunmore DT273 metallized film having heat-activated adhesive layer to the exposed surface of the thermal gap filler. In which case, the thermal gap filler and the Dunmore DT273 metallized film may thus be drawn between a pair of laminating rollers that form a laminating nip. As another example, process 312 may include laminating a Dunmore DT101 metallization transfer layer to the exposed surface of the thermal gap filler. In this latter example, the thermal gap filler and the Dunmore DT101 metallization transfer layer may thus be drawn between a pair of laminating rollers that form a laminating nip.

The thermal resistance was measured for a test specimen made in accordance with the method 300. The test specimen included a gap filler having a release liner on one side and a Dunmore DT273 metallized film laminated to the other side of the gap filler from which the release liner had been previously removed at process 308.

The thermal resistance for this test specimen was tested as follows. The lower release liner (i.e., the lower pre-existing release liner that was not removed at process 308) was removed from the gap filler. The gap filler was then placed exposed side down (the side from which the lower release liner was removed, or the side not having laminated thereto the DT273 metallized film) on an ASTM D5470 platen. The protective release liner was removed from the Dunmore DT273 metallized film. The pressure was closed to a pressure of 50 pounds per square inch, and thermal resistance was measured at 50° C. Using this exemplary testing, the thermal resistance was about 0.17° C.-in$^2$/W for this test specimen formed from gap filler and Dunmore DT273 metallized film.

By way of comparison, the thermal resistance of the gap filler alone (i.e., without any metallization or metal layers laminated thereto and without any release liners or release coatings) was about 0.14° C.-in$^2$/W. In addition, the thermal resistance was about 0.21° C.-in$^2$/W for a gap filler having a relatively thick silicone-based conformal dry coating. From the above testing, it may be observed that the test specimen formed from the gap filler and Dunmore DT273 metallized transfer film yielded better thermal performance results than the gap filler having the relatively thick silicone-based conformal dry coating.

Figure 4:
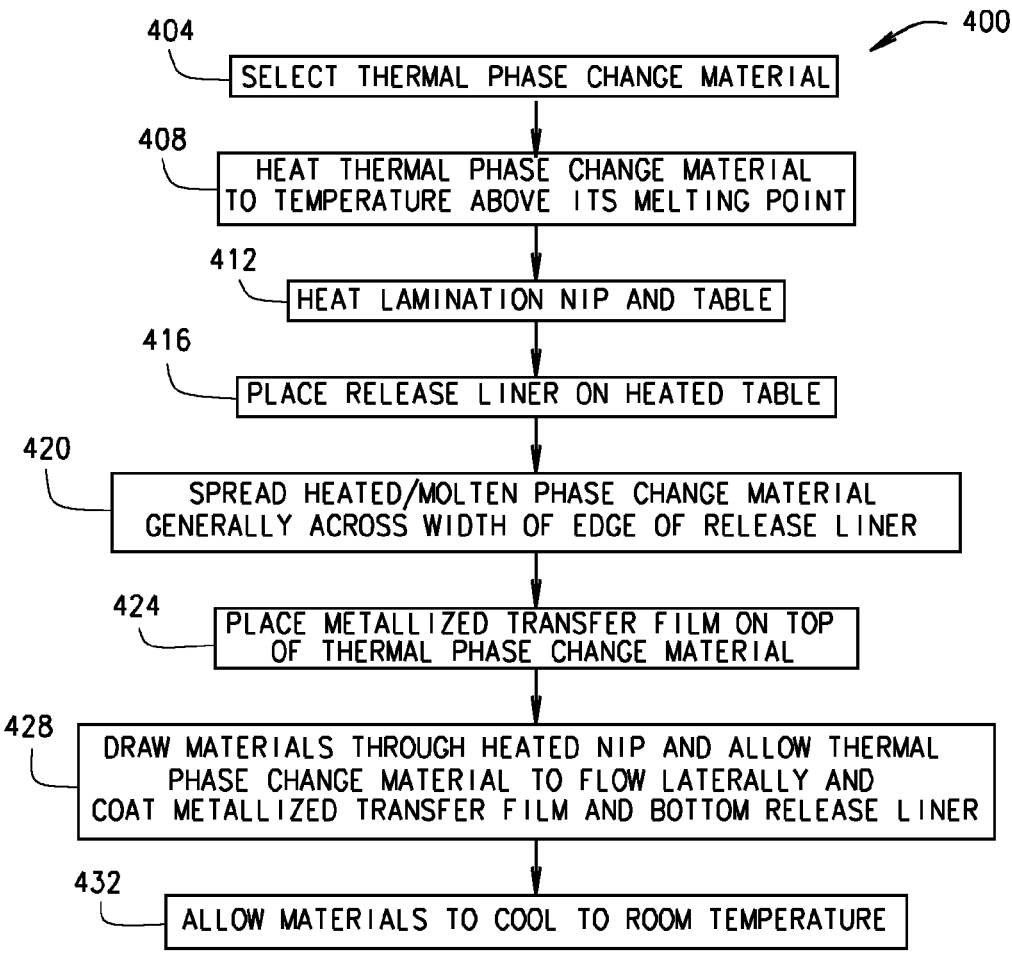
FIG. 4 is a process flow diagram of another exemplary method for making an assembly that includes a thermal interface material and a metallization or metal layer.

FIG. 4 illustrates another exemplary method 400 by which a TIM assembly may be formed. Generally, this method 400 includes casting a thermal interface material (e.g., thermal phase change material, thermally conductive electrical insulator, gap filler, putty, etc.) using the metallized transfer film as a liner via a solvent or non solvent process. For example, in those embodiments which use a phase change material, the phase change material may be heated above its melt point and extruded using the metallized transfer film as one of two liners.

In the particular illustrated embodiment 400 shown in FIG. 4, process 404 includes selecting a thermal phase change material. For example, the thermal interface phase change material may be in bulk without any release liners. In such embodiments, the thermal interface phase change material may be discharged from a dispenser onto a release coated liner or a metallization or metal layer. By way of further example, the thermal phase change material may be a T-pcm™ 580S series thermal phase change material commercially available from Laird Technologies, Inc. Alternative materials may also be used, including thermal interface materials without any release liners, only one release liner, or upper and lower release liners. In those embodiments in which the thermal phase change material includes one or more release liners, the method 400 also includes removing the release liners.

Process 408 includes heating the thermal phase change material to a temperature above its melting point. For example, some embodiments may include heating the thermal phase change material to about 100° C. Other embodiments may include heating the thermal phase change material to a higher or lower temperature depending on the particular thermal phase change material selected at process 404 and the melting temperature thereof.

Process 412 includes heating a lamination nip and a table. For example, some embodiments may include heating the lamination nip and table to about 100° C. Alternative embodiments may include heating the lamination nip and table to a higher or lower temperature depending on the particular thermal phase change material selected at process 400. The lamination nip may be formed by a pair of laminating rollers.

Process 416 includes placing a release liner on the heated table. In some embodiments, the release liner comprises siliconized polyester or paper.

Process 420 includes spreading the heated and molten phase change material generally across a width of at least one edge of the release liner.

Process 424 includes placing a metallized transfer film, metallization or metal layer generally on top of the thermal phase change material. Accordingly, the thermal phase change material is thus disposed generally between or sandwiched generally by the release liner (on the bottom) and the metallized transfer film (on the top). In alternative method embodiments, the orientation or arrangement of the layers may be reversed such that the thermal phase change material is disposed generally between or sandwiched generally by the release liner (on the top) and the metallized transfer film (on the bottom). In such alternative methods, the metallization transfer film may be placed on the heated table at process 416 with the heated and molten phase change material then being spread generally across a width of at least one edge of the metallized transfer film at process 420.

Process 428 includes pulling or drawing the stack of materials (e.g., release liner, thermal phase change material, and metallized transfer film) through the heated lamination nip and allowing the thermal phase change material to flow laterally and coat the metallized transfer film and release liner.

Process 432 includes allowing the laminated stack of materials (release liner, thermal phase change material, and metallized transfer film) to cool to room temperature.

Even though a thermal interface material with metallization or metal layer or film (e.g., 100, etc.) may be formed as disclosed above and shown in FIGS. 2 through 4, such is not required for all embodiments. For example, other embodiments may include other processes besides laminating (FIGS. 2 and 3) and casting (FIG. 4). By way of example, other embodiments may include directly metallizing a surface of a thermal interface material via vapor deposition, sputtering, or vacuum metallization rather than lamination. Other embodiments may include thin metal layers or transfer films that are applied via transfer from a carrier (e.g., polyester liner, etc.) or directly flash coated onto a thermal interface material. Still further embodiments may include calendaring between rollers.

Embodiments (e.g., 100, 500, etc.) disclosed herein may be used with a wide range of heat-generating components, heat sinks, and associated devices. By way of example only, exemplary applications include printed circuit boards, high frequency microprocessors, central processing units, graphics processing units, laptop computers, notebook computers, desktop personal computers, computer servers, thermal test stands, etc. Accordingly, aspects of the present disclosure should not be limited to use with any one specific type of heat-generating component or associated device.

Numerical dimensions and the specific materials disclosed herein are provided for illustrative purposes only. The particular dimensions and specific materials disclosed herein are not intended to limit the scope of the present disclosure, as other embodiments may be sized differently, shaped differently, and/or be formed from different materials and/or processes depending, for example, on the particular application and intended end use.

Certain terminology is used herein for purposes of reference only, and thus is not intended to be limiting. For example, terms such as "upper", "lower", "above", "below", "upward", "downward", "forward", and "rearward" refer to directions in the drawings to which reference is made. Terms such as "front", "back", "rear", "bottom" and "side", describe the orientation of portions of the component within a consistent, but arbitrary, frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A thermal interface material assembly comprising:
    a thermal interface material having a first side and a second side, and which is conformable and comprises polymer;
    a metallization layer having a layer thickness of about 0.0005 inches or less, the metallization layer disposed along at least a portion of the first side of the thermal interface material; and
    a release liner having a release side with a release coating thereon;
    wherein the metallization layer comprises metal disposed over and directly on the release coating on the release side of the release liner such that the metallization layer is directly between the release coating and the first side of the thermal interface material, without any intervening layers; and
    wherein the release liner is configured to be removable from the thermal interface material assembly such that removal of the release liner exposes the metallization layer which remains disposed along the at least a portion of the first side of the thermal interface material for positioning against a mating component.

2. The assembly of claim 1, wherein the metallization layer has a layer thickness of 0.0005 inches or less and is conformable to a surface.

3. The assembly of claim 1, wherein the metallization layer has a layer thickness less than 0.0001 inches.

4. The assembly of claim 1, wherein the metallization layer has a higher thermal conductivity than the thermal interface material, and wherein the metallization layer comprises metal less conformable than the thermal interface material.

5. The assembly of claim 1, further comprising a substrate supporting the metallization layer, and wherein the substrate is laminated to the thermal interface material such that the metallization layer is between the substrate and the first side of the thermal interface material.

6. The assembly of claim 1, wherein the metallization layer comprises a layer of metal deposited directly onto the thermal interface material.

7. The assembly of claim 1, wherein the metallization layer is aluminum or copper.

8. The assembly of claim 1, wherein the thermal interface material comprises a compliable or conformable thermal interface material including one or more of a gap filler or a thermally conductive insulator.

9. An apparatus comprising the assembly of claim 1, a heat-generating component, and a heat sink, wherein the assembly is disposed between the heat-generating component and the heat sink thereby providing a thermally-conducting heat path from the heat-generating component to the heat sink.

10. A method of making a thermal interface material assembly of claim 1, the method comprising providing a thermal interface material, which is conformable and comprises polymer, with a metallization layer along at least a portion of a first side of the thermal interface material such that the metallization layer has a layer thickness of about 0.0005 inches or less.

11. The method of claim 10, wherein providing the thermal interface material with the metallization layer includes metallizing a surface portion of the thermal interface material to thereby form the metallization layer.

12. The method of claim 10, wherein providing the thermal interface material with the metallization layer includes depositing metal directly onto a surface portion of the thermal interface material or onto a surface portion of a release liner for subsequent transfer to the thermal interface material.

13. The method of claim 12, wherein depositing metal includes one or more of vapor deposition, vacuum metallization, or flash coating.

14. The method of claim 10, wherein providing the thermal interface material with the metallization layer includes laminating the thermal interface material and a substrate supporting the metallization layer such that the metallization layer is between the substrate and the first side of the thermal interface material.

15. The method of claim 14, further comprising depositing metal onto the substrate via one or more of vapor deposition, vacuum metallization, or sputtering.

16. The method of claim 14, wherein the substrate includes a release liner having a release side siliconized to provide a release coating thereon, and wherein the metallization layer comprises metal disposed over the release coating.

17. The method of claim 10, wherein providing the thermal interface material with the metallization layer includes providing the thermal interface material with a metallization layer having a layer thickness of less than 0.0001 inches.

18. The method of claim 10, wherein providing the thermal interface material with the metallization layer includes casting the thermal interface material using a metallized transfer film as a liner via a solvent or non-solvent process.

19. The method of claim 10, wherein the thermal interface material comprises a phase change material, and wherein providing the thermal interface material with the metallization layer includes:
    heating the phase change material to a temperature above a melting temperature of the phase change material;

extruding the molten phase change material while using a metallized transfer film as a liner.

20. The method of claim 10, wherein the thermal interface material comprises a phase change material, and wherein providing the thermal interface material with the metallization layer includes:
heating the phase change material to a temperature above a melting temperature of the phase change material;
heating a lamination nip and a table;
placing one of a release liner or a metallized transfer film on the heated table;
spreading the heated molten phase change material across a width of at least one edge of said one of the release liner or metallized transfer film that was placed on the heated table;
placing the other one of said release liner and metallized transfer film on the phase change material such that the phase change material is generally between the release liner and metallized transfer film;
drawing the release liner, phase change material, and metallized transfer film through the heated lamination nip and allowing the phase change material to flow laterally and coat the metallized transfer film and release liner; and
allowing the release liner, phase change material, and metallized transfer film to cool to room temperature.

21. A method associated with heat transfer from a heat-generating component, the method comprising installing a thermal interface material assembly of claim 1 between a surface of the heat-generating component and a surface of a heat sink to thereby establish a thermally conducting heat path from the heat-generating component to the heat sink.

22. The assembly of claim 1, wherein the metallization layer is configured to be releasable from a mating component in contact with the metallization layer, thereby allowing the thermal interface material assembly having the metallization layer to release from the mating component after being installed with the metallization layer against the mating component.

23. The assembly of claim 1, wherein:
the thermal interface material has a thermal conductivity of about 1.2, 3, 3.8, or 6 Watts per meter per Kelvin; and/or
the thermal interface material has a thermal resistance at 10 pounds per square inch of about 0.019, 0.020, 0.16, 0.21, 0.37, 0.46, 0.49, 0.6, 0.62, 0.84, 0.85, 1.09, 1.15, 1.5, 1.8, 1.23, or 2.22 degrees Celsius inch squared per Watt; and/or
the thermal interface material assembly has a thermal resistance at 50 pounds per square inch of about 0.045 or 0.08 degrees Celsius inch squared per Watt.

24. The assembly of claim 1, wherein the thermal interface material comprises elastomer and at least one thermally-conductive filler.

25. A thermal interface material assembly comprising:
a thermal interface material having a first side and a second side, and which is conformable and comprises polymer;
a metallization layer having a layer thickness of about 0.0005 inches or less, the metallization layer disposed along at least a portion of the first side of the thermal interface material; and
a release liner having a release side with a release coating thereon, and wherein the metallization layer is a metal film disposed over and directly on the release coating on the release side of the release liner such that the metal film is directly between the release coating and the first side of the thermal interface material, without any intervening layers; wherein the release liner is configured to be removable from the thermal interface material assembly such that removal of the release liner exposes the metallization film which remains disposed along the at least a portion of the first side of the thermal interface material for positioning against a mating component.

26. A thermal interface material assembly comprising:
a thermal interface material having a first side and a second side, and which is conformable and comprises polymer;
a metallization layer having a layer thickness of about 0.0005 inches or less, the metallization layer disposed along at least a portion of the first side of the thermal interface material;
an upper release liner including a release coating and supporting the metallization layer such that the metallization layer is directly between the release coating and the first side of the thermal interface material, without any intervening layers; wherein the release coating is configured to allow the upper release liner to be removed from the thermal interface material assembly such that the metallization layer is exposed and remains disposed along the first side of the thermal interface material for positioning against a mating component; and
a lower release liner having a release side with a release coating thereon, the lower release liner laminated such that the release coating is between the lower release liner and the second side of the thermal interface material.

27. A thermal interface material assembly comprising:
a thermal interface material having a first side and a second side, and which is conformable and comprises polymer;
a metallization layer having a layer thickness of about 0.0005 inches or less, the metallization layer disposed along at least a portion of the first side of the thermal interface material; and
a release liner having a release side siliconized to provide a release coating thereon, wherein the metallization layer comprises a metallization on the siliconized release side of the release liner, and wherein the release liner is laminated to the thermal interface material such that the metallization layer is directly between the release liner and the first side of the thermal interface material, without any intervening layers.

28. The assembly of claim 27, wherein the release liner is configured to be removable from the thermal interface material assembly such that removal of the release liner exposes the metallization layer which remains disposed along the at least a portion of the first side of the thermal interface material for positioning against a mating component.

29. A thermal interface material assembly comprising:
a thermal interface material having a first side and a second side, and which is conformable and comprises polymer; and
a metallization layer having a layer thickness of about 0.0005 inches or less;
an upper release liner including a release coating and supporting the metallization layer, and being laminated to the thermal interface material such that the metallization layer is directly between the release coating and the first side of the thermal interface material, without any intervening layers; wherein the release coating is configured to allow the upper release liner to be removed from the thermal interface material assembly such that the metallization layer is exposed and remains disposed along the first side of the thermal interface material for positioning against a mating component; and
a lower release liner including a release coating and being laminated to the thermal interface material such that the release coating is between the lower release liner and the second side of the thermal interface material.

30. The assembly of 29, wherein the metallization layer has a layer thickness less than 0.0001 inches.

31. The assembly of claim 29, wherein the upper release liner comprises a substrate having a release side siliconized to provide the release coating thereon, and wherein the metallization layer comprises a metallization on the siliconized release side of the substrate.

32. The assembly of claim 29, wherein the thermal interface material comprises a compliable or conformable thermal interface material including one or more of a gap filler, putty, or a thermally conductive insulator.

* * * * *

UNITED STATES PATENT AND TRADEMARK OFFICE
CERTIFICATE OF CORRECTION

PATENT NO. : 8,545,987 B2  
APPLICATION NO. : 11/938588  
DATED : October 1, 2013  
INVENTOR(S) : Jason Strader and Mark Wisniewski Page 1 of 1

It is certified that error appears in the above-identified patent and that said Letters Patent is hereby corrected as shown below:

In the Claims

CLAIM 23
Column 15, line 49: delete "0.045 or" after "50 pounds per square inch of about"

CLAIM 26
Column 16, line 7: replace "haying" with "having" after "a thermal interface material"

CLAIM 26
Column 16, line 9: replace "haying" with "having" after "a metallization layer"

Signed and Sealed this
Tenth Day of December, 2013

Margaret A. Focarino
*Commissioner for Patents of the United States Patent and Trademark Office*